(12) United States Patent
Wu et al.

(10) Patent No.: US 10,276,821 B2
(45) Date of Patent: Apr. 30, 2019

(54) ELECTROLUMINESCENT DEVICE

(71) Applicant: National Taiwan University, Taipei (TW)

(72) Inventors: Chung-Chih Wu, Taipei (TW); Min Jiao, Taipei (TW); Chun-Yang Lu, Taipei (TW); Wei-Kai Lee, Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 269 days.

(21) Appl. No.: 15/332,254

(22) Filed: Oct. 24, 2016

(65) Prior Publication Data
US 2017/0125721 A1 May 4, 2017

Related U.S. Application Data

(60) Provisional application No. 62/285,461, filed on Oct. 30, 2015.

(51) Int. Cl.
*H01L 51/52* (2006.01)
*H01L 51/00* (2006.01)

(52) U.S. Cl.
CPC ...... *H01L 51/5203* (2013.01); *H01L 51/5206* (2013.01); *H01L 51/5221* (2013.01); *H01L 51/5262* (2013.01); *H01L 51/5275* (2013.01); *H01L 51/0037* (2013.01); *H01L 51/5268* (2013.01)

(58) Field of Classification Search
CPC .................................................. H01L 51/5265
See application file for complete search history.

(56) References Cited

U.S. PATENT DOCUMENTS

2016/0064672 A1* 3/2016 Lee ...................... H01L 51/0021 257/40
2016/0293892 A1* 10/2016 Yamae ................ H01L 51/5268

OTHER PUBLICATIONS

R. H. Jordan et al., Appl. Phys. Lett. 69, 1997 (1996).*

* cited by examiner

*Primary Examiner* — Raj R Gupta
(74) *Attorney, Agent, or Firm* — WPAT, PC

(57) ABSTRACT

An electroluminescent (EL) device is disclosed, comprising a high-index layer, having a first refractive index more than 1.8; a first electrode, which is transparent and disposed adjacent to the high-index layer; one or more functional layers, disposed adjacent to the first electrode and opposite to the high-index layer, including a light emitting layer; and, a second electrode, disposed adjacent to the one or more functional layers and opposite to the first electrode; wherein the first electrode has a second refractive index less than 1.7.

11 Claims, 7 Drawing Sheets

ELECTROLUMINESCENT DEVICE

CROSS-REFERENCE TO RELATED APPLICATION

This application claims priority to and the benefit of U.S. Provisional Patent Application Ser. No. 62/285,461, filed on Oct. 30, 2015, and entitled "Electroluminescent Devices with Improved Light Extraction", the disclosure of which is incorporated by reference in its entirety.

FIELD OF THE INVENTION

The present invention pertains to an electroluminescent (EL) device, and more particularly pertains to an organic light-emitting device (OLED) structures with improved optical out-coupling and their applications.

BACKGROUND OF THE INVENTION

Since reports of efficient and practical organic light-emitting devices (OLEDs) in 1987 by Tang and VanSlyke, OLEDs have been subjects of intensive studies and development for displays and lighting applications. Please refer to FIG. 1(a), a typical OLED has the organic layer(s) sandwiched between one reflective metal electrode (usually cathode) and one transparent indium tin oxide (ITO) electrode (usually anode) on glass substrates. By adopting efficient emitting materials such the phosphorescence mechanisms, the internal quantum efficiencies of OLEDs can reach nearly 100%. However, in typical OLED structures, the optical out-coupling of OLED internal emission to air is an issue for achieving high external quantum efficiencies.

Usually, the ITO and organic layers have higher refractive indices (n; n~1.8-2.1 for ITO and ~1.7-1.8 for organic layers in OLEDs) than the typical substrates (e.g., glasses and plastics etc., n~1.4-1.5) and air (n=1). Thus, due to the significant refractive-index mismatches at air/substrate and substrate/ITO interfaces in typical OLEDs, OLED internal emission usually suffers total internal reflection and hence most of internal radiation is trapped and guided inside the device. In general, internal radiation in OLEDs is coupled into four different modes: radiation modes that are out-coupled to air as useful emission, substrate modes that are trapped and waveguided in the substrate, waveguided modes that are trapped and waveguided in the high-index organic/ITO layers, and surface-plasmon (SP) modes that are guided along the organic/metal interface, as illustrated in FIG. 1(b). Thus, the out-coupling efficiency of conventional and typical OLED devices is usually only about 20-25%, and there is a great demand in enhancement in external quantum efficiency (EQE) of OLEDs by increasing the light out-coupling, in particular for applications that impose strong requirements on power efficiencies (e.g., lighting and mobile applications etc.).

SUMMARY OF THE PRESENT INVENTION

In order to overcome the drawbacks of prior arts, the present invention provides various embodiments described below.

In certain embodiments, an electroluminescent (EL) device is disclosed, comprising a high-index layer, having a first refractive index $n_H$ more than 1.8; a first electrode, disposed adjacent to the high-index layer; one or more functional layers, disposed adjacent to the first electrode and opposite to the high-index layer, including a light emitting layer, wherein a main wavelength of a light emitted from the light emitting layer is $\lambda$; and, a second electrode, disposed adjacent to the one or more functional layers and opposite to the first electrode; wherein the first electrode has a second refractive index $n_L$ less than 1.7.

In certain embodiments, the high-index layer is $TiO_2$ films, which is deposited by e-beam evaporation or by RF sputtering.

In certain embodiments, a thickness of the high-index layer is about $\lambda/4n_H$ or odd multiple of $\lambda/4n_H$, and a thickness of the first electrode is about $\lambda/4n_L$ or odd multiple of $\lambda/4n_L$.

In certain embodiments, the electroluminescent (EL) device further comprises one or more sub-layers from Layer 1 to Layer j, disposed in conjunction with the first electrode, which is sandwiched between the high-index layer and the light emitting layer, and thicknesses of the sub-layers and the first electrode correspond to:

$$\sum_{i=1}^{j} k_i L_i + k_c L_c = \frac{\pi}{2}$$

or odd multiple of $$\frac{\pi}{2},$$

wherein j is a natural number;
$k_i$ is a wave vector of Layer i, $k_i = 2\pi \times n_i/\lambda$, $n_i$ is a refractive index of Layer i;
$L_i$ is a thickness of Layer i;
$k_c$ is a wave vector of the first electrode, $k_c = 2\pi \times n_L/\lambda$; and
$L_c$ is a thickness of the first electrode, which is at least equal to or larger than the total thickness of the sub-layers from layer 1 to layer j.

In certain embodiments, the first refractive-index material of the high-index layer is selected from the group consisting of $TiO_2$, $Ta_2O_5$, $ZrO_2$, $Al_2O_3$, ZnO, $HfO_2$, ZnS, $SiN_x$, $Nb_2O_5$, $CeO_2$, indium tin oxide (ITO), fluorine-doped tin oxide, aluminum zinc oxide, gallium zinc oxide, tin oxide, niobium-doped titanium oxide, their combination, and their stacking.

In certain embodiments, the second refractive-index material of the first electrode is selected from the group consisting of PEDOT:PSS, nanoporous indium tin oxide (ITO), nanoporous fluorine-doped tin oxide, nanoporous aluminum zinc oxide, nanoporous gallium zinc oxide, nanoporous tin oxide, nanoporous niobium-doped titanium oxide, their combination, and their stacking.

In certain embodiments, the light emitting layer has a preferential horizontal emitting dipole orientation, and the horizontal emitting dipole ratio is larger than 70%. In preferred embodiments, the horizontal dipole ratio of the light emitting layer is approaching 100% and the higher refractive index $n_H$ of the high-index layer is approaching 3.

In certain embodiments, the electroluminescent (EL) device further comprises a substrate or a superstrate adjacent to the high-index layer and opposite to the first electrode, and the substrate or the superstrate has a refractive index lower than the refractive index $n_H$ of the high-index layer. In preferred embodiments, the substrate or the superstrate has an outer sub-surface opposite to the high-index layer, and the outer sub-surface is shaped or roughening treated to form regular or irregular patterns, such as prism, pyramid, macro-lens, microlens, micro-prism, micro-pyramid, or grating. In another preferred embodiments, the substrate or the super-strate has an outer sub-surface opposite to the high-index layer, and an optical element adjacent to the outer sub-surface, the optical element comprises a prism, a pyramid, a hemisphere lens, a macrolens sheet, a microlens sheet, a micro-prism sheet, a micro-pyramid sheet, a micro-particle layer, a nano-particle layer, a microporous layer, a nanop-orous layer, a grating sheet, a scattering sheet, a diffuser sheet, arrays of pores, arrays of crevices, arrays of air bubbles, or arrays of vacuum pores.

The electroluminescent device disclosed here, when used in lighting or display panels, may further be integrated with metal bus lines or metal grids having high conductivity for current conduction and for uniform current spreading over larger areas.

DETAILED DESCRIPTION OF THE INVENTION

It is to be understood that both the foregoing general description and the following detailed description are exemplary and explanatory only and are not restrictive of the invention, as claimed. It should be noted that, as used in the specification and the appended claims, the singular forms "a", "an" and "the" include plural referents unless the context clearly dictates otherwise. The use of the terms "contain", "contains", "containing", "include", "includes", "including," "have," "has," or "having" should be generally understood as open-ended and non-limiting unless specifically stated otherwise. The use of the direction terms "top", "bottom", "on", "under", "up", "down", "left", "right", "front" or "rear", etc. is only reference to the drawings. Thus, the direction is not limited in the present invention. References cited herein are hereby incorporated by reference in their entirety, except to the extent that they conflict with teachings explicitly set forth in this specification.

Figure 1A:
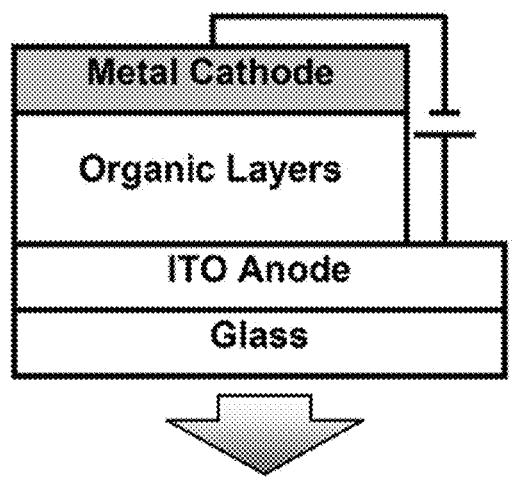
FIG. 1(a) shows the schematic structure of typical bottom-emitting OLED.
Figure 1B:
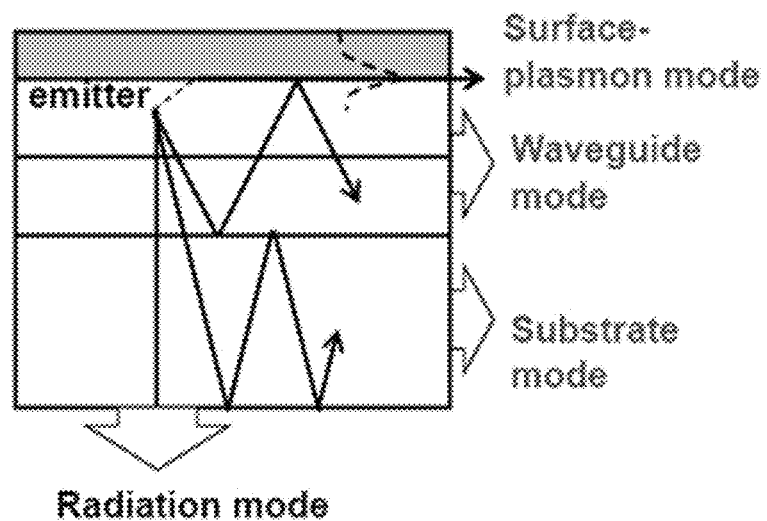
FIG. 1(b) shows the schematic structure of typical bottom-emitting OLED, which is coupled into four different modes: "radiation modes", "substrate modes", "waveguid modes" and "surface-plasmon (SP) modes".
Figure 2:
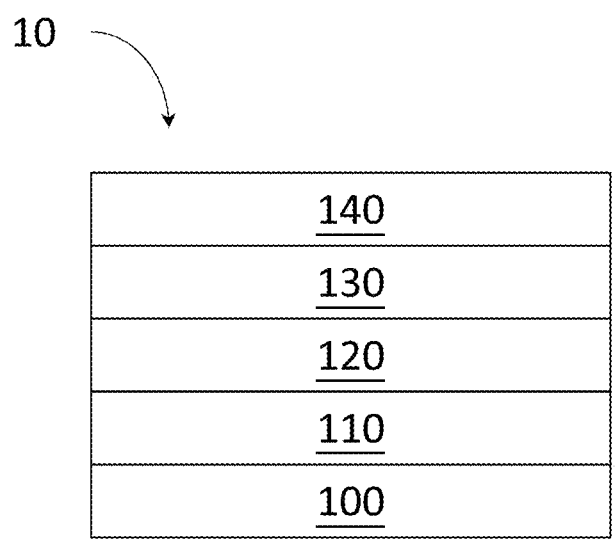
FIG. 2 shows the schematic structure of an electroluminescent (EL) device in the present invention

Please refer to FIG. 2, the present invention discloses an electroluminescent (EL) device 10 with improved light extraction. The electroluminescent (EL) device 10, such as OLED, comprises a high-index layer 110, having a first refractive index $n_H$ more than 1.8; a first electrode 120, which is transparent and disposed adjacent to the high-index layer 110; one or more functional layers 130, disposed adjacent to the first electrode 120 and opposite to the high-index layer 110, including a light emitting layer, wherein a main wavelength of a light emitted from the light emitting layer is λ; and, a second electrode 140, disposed adjacent to the one or more functional layers 130 and opposite to the first electrode 120. Specially, the first electrode 120 has a second refractive index $n_L$ less than 1.7.

In certain embodiments, the electroluminescent (EL) device further comprises a substrate or superstrate 100 adjacent to the outer surface of the high-index layer 110, and the substrate or superstrate 100 has an outer sub-surface and an inner sub-surface, the inner sub-surface is facing the light emitting layer, and the outer sub-surface is opposite to the inner sub-surface and facing the air. The substrate or superstrate 100 has a refractive index lower than the refractive index $n_H$ of the high-index layer 110.

The first electrode 120 may be an anode or cathode of the electroluminescent devices. The light-emitting layer of the functional layers 130 may contain emitting materials having preferential horizontal emitting dipoles (relative to the layer surface) with the horizontal dipole ratio being larger than 70%.

By appropriately adjusting the thicknesses of the high-index layer 110, the low-refractive-index first electrode 120, and the distances of the emitting layer to electrodes, the optical coupling efficiencies of internal emission into air and into substrate/superstrate 100 are substantially increased over those of devices using conventional higher-index transparent electrodes (e.g. ITO, n>1.8) and those of devices using lower-index transparent electrodes (e.g. PEDOT:PSS, n≤1.55).

In one case, the high-index layer 110 has a thickness of about $\lambda/4n_H$ or odd multiple of $\lambda/4n_H$, wherein $\lambda$ is a main wavelength of a light emitted from the light emitting layer. The low-refractive-index first electrode 120 is sandwiched between the high-index layer 110 and the light-emitting layer, and the low-refractive-index first (transparent) electrode 120 has a thickness of about $\lambda/4n_L$ or odd multiple of $\lambda/4n_L$.

In another case, the electroluminescent (EL) device further comprises one or more sub-layers from Layer 1 to Layer j, along with the low-refractive-index first (transparent) electrode 120, being sandwiched between the high-refractive-index layer 110 and the light emitting layer 130, and thicknesses of sub-layers and the low-refractive-index first (transparent) electrode 120 roughly correspond to:

$$\sum_{i=1}^{j} k_i L_i + k_c L_c = \frac{\pi}{2}$$

or odd multiple of $$\frac{\pi}{2},$$

wherein:

j is a natural number;

$k_i$ is a wave vector of Layer i, $k_i=2\pi \times n_i/\lambda$, $n_i$ is a refractive index of Layer i;

$L_i$ is a thickness of Layer i;

$k_c$ is a wave vector of the first electrode 120, $k_c=2\pi \times n_L/\lambda$; and $L_c$ is a thickness of the first electrode 120, which is at least equal to or larger than the total thickness of sub-layers from layer 1 to layer j.

In certain embodiments, the high-refractive-index layer 110 is selected from the group consisting of $TiO_2$, $Ta_2O_5$, $ZrO_2$, $Al_2O_3$, ZnO, $HfO_2$, ZnS, $SiN_x$, $Nb_2O_5$, $CeO_2$, indium tin oxide (ITO), fluorine-doped tin oxide, aluminum zinc oxide, gallium zinc oxide, tin oxide, niobium-doped titanium oxide, their stacking, their combinations, or composite materials containing these high-refractive-index materials.

In certain embodiments, the low-refractive-index first (transparent) electrode 120 is selected from the group consisting of PEDOT:PSS, nanoporous indium tin oxide (ITO), nanoporous fluorine-doped tin oxide, nanoporous aluminum zinc oxide, nanoporous gallium zinc oxide, nanoporous tin oxide, nanoporous niobium-doped titanium oxide, their stacking, and their combinations.

In one case, the outer sub-surface of the substrate or superstrate 100 is shaped or roughening treated, forming regular or irregular patterns, such as prism, pyramid, macrolens, microlens, micro-prism, micro-pyramid, or grating etc.

In another case, the electroluminescent (EL) device further comprises an optical element (no shown) adjacent to the outer sub-surface of the substrate or superstrate 100. The optical element comprises a prism, a pyramid, a hemisphere lens, a macrolens sheet, a microlens sheet, a micro-prism sheet, a micro-pyramid sheet, a micro-particle layer, a nano-particle layer, a microporous layer, a nanoporous layer, a grating sheet, a scattering sheet, a diffuser sheet, arrays of pores, arrays of crevices, arrays of air bubbles, arrays of vacuum pores etc.

Electroluminescent devices disclosed here can include a substrate or superstrate 100 comprising no out-coupling treatment; or, a substrate or superstrate 100 comprising an out-coupling treatment. Enhanced light out-coupling and external quantum efficiency can be obtained from such device structures including a substrate or superstrate 100 comprising no out-coupling treatment, and even higher light out-coupling and external quantum efficiency can be obtained from such device structures including a substrate or superstrate 100 comprising an out-coupling treatment.

The electroluminescent device disclosed here, when used in lighting or display panels, may further be integrated with metal bus lines or metal grids having high conductivity for current conduction and for uniform current spreading over larger areas.

The use of the term "about" or "roughly" is before a quantitative value, the present teachings also include the specific quantitative value itself, unless specifically stated otherwise. As used herein, the term "about" refers to a ±20% variation from the nominal value unless otherwise indicated or inferred.

The following examples are provided to illustrate further and to facilitate the understanding of the present teachings Embodiment of Invention—Example 1

In one possible embodiment of this invention, the first electrode 120 could be the transparent conducting polymer poly(3,4-ethylenedioxythiophene):poly(styrenesulfonate) (PEDOT:PSS) with sufficient conductivity. The conducting polymer poly(3,4-ethylenedioxythiophene):poly(styrenesulfonate) (PEDOT:PSS) has excellent mechanical flexibility, good transmittance and conductivity, solution processing capability, and low cost. With a conductivity almost comparable to that of ITO, high-conductivity PEDOT:PSS had been successfully used as transparent electrodes for OLEDs as well as organic solar cells in recent years. The high-index layer 110 could be the high-refractive-index material $TiO_2$. PEDOT:PSS possesses optical properties (e.g., refractive index, n~1.5) rather different from those of the widely used transparent conductor ITO (n~1.9-2.1) and typical organic layers (n~1.7-1.9).

Here, a comprehensive theoretical analyses of the optical out-coupling efficiency of OLEDs is performed. A conventional ITO device is a layer stacking structures for OLEDs using the higher-index ITO transparent anode (first electrode). A conventional PEDOT device is a layer stacking structures for OLEDs using the low-index PEDOT:PSS transparent anode (first electrode). This invention is a layer stacking structures for OLEDs using the low-index PEDOT:PSS anode (first electrode) 120 yet with a high-index TiO2 layer 110 inserted between the PEDOT:PSS 110 and the substrate 100. By inserting a high-index layer 110 below the PEDOT:PSS electrode 120, the optical out-coupling efficiency and EQE of the invention can be significantly enhanced over those of the conventional ITO devices and PEDOT devices having no high-index layer 110.

The conventional ITO device and PEDOT device for both simulation and experiment studies in this work adopted the general green phosphorescent OLED structure: glass substrate/transparent anode (80-nm ITO for the ITO device; or 100-nm double-layer PEDOT:PSS for the PEDOT device)/ TAPC/CBP:Ir(ppy)$_2$(acac) 8 wt. % (20 nm)/B3PYMPM/LiF (0.5 nm)/Al (150 nm).

Wherein TAPC (di-[4-(N,N-ditolyl-amino)-phenyl]-cyclohexane) served as the hole transport layer (HTL). CBP [4,4'-bis(carbazol-9-yl) biphenyl] doped with 8 wt. % Ir(ppy)$_2$(acac) [bis(2-phenylpyridine)(acetylacetonato) iridium(III)] was used as the phosphorescent green emitting layer (EML). The photoluminescence (PL) peak wavelength and quantum yield of Ir(ppy)$_2$(acac) were measured to be ~520 nm and ~96%, respectively. B3PYMPM (4,6-bis(3,5-di(pyridin-3-yl)phenyl)-2-methylpyrimidine) was used as the electron transport layer (ETL). LiF and Al were the electron injection layer and the cathode, respectively. All layers above the ITO or PEDOT:PSS anodes were deposited by thermal evaporation and were defined by in-situ shadow masking (typically with an active device area of 1 mm$^2$).

In the conventional PEDOT device, the PEDOT:PSS anode was composed of a 75-nm high-conductivity PEDOT:PSS layer (conductivity~900-1000 S/cm, for lateral conduction) and a 25-nm low-conductivity PEDOT:PSS layer (conductivity~0.1 S/cm, for hole injection). These PEDOT:PSS materials and the two-layer PEDOT:PSS were Low-conductivity PEDOT:PSS.

The optical model used for simulation is based on the equivalence between molecular emission through electronic dipole transitions and radiation from classical electrical dipole antenna. With plane-wave expansion of the dipole field (with each plane-wave mode being characterized by an in-plane wave vector $k_t$), electromagnetic fields generated by a radiation dipole embedded in a layered structure is calculated, from which the distribution of the radiation power into different plane-wave modes and the far-field radiation can be obtained. Emission characteristics of an OLED are calculated by assuming that the emitting layer contains an ensemble of mutually incoherent dipole radiators with distributions in orientations, locations, and frequencies. For the phosphorescent emitter Ir(ppy)$_2$(acac) doped in CBP, a horizontal dipole ratio of 76% (and a vertical dipole ratio of 24%) was assumed, based on our own results and others' measurements.

Figure 3A:
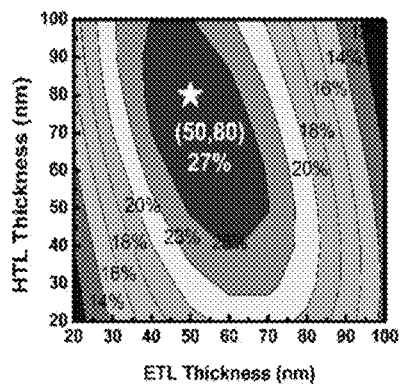
FIG. 3(a) and FIG. 3(b) show the calculated out-coupling efficiencies of the conventional ITO device and the PEDOT device, respectively, as a function of the ETL and the HTL thicknesses.
Figure 3B:
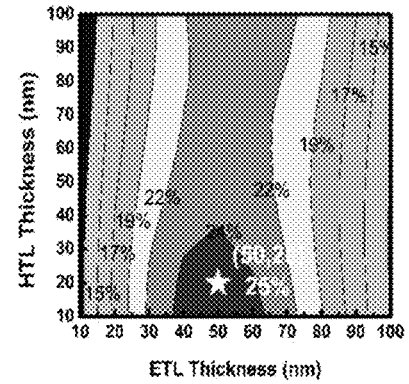

The out-coupling efficiencies of internally generated radiation into air were calculated by locating emitting dipoles in the emitting layer and by considering the full spectral distribution of radiating dipoles [using the PL spectrum of CBP:Ir(ppy)$_2$(acac)]. FIG. 3(a) and FIG. 3(b) show the calculated out-coupling efficiencies of the conventional ITO device and the PEDOT device, respectively, as a function of the ETL and the HTL thicknesses (for the example ITO and PEDOT:PSS thicknesses of 80 and 100 nm, respectively). Similar analyses were conducted with other ITO and PEDOT:PSS anode thicknesses; the ITO thickness of 80 nm is the optimal condition and meanwhile the PEDOT:PSS thickness does not quite affect the out-coupling efficiency (since its refractive index matches that of the substrate). Please refer to Table 1, from such analyses, the conventional ITO device with (ITO, ETL, HTL) thickness of (80 nm, 50 nm, 80 nm) gives the maximal out-coupling efficiency of ~27%. Similarly, the conventional PEDOT device with (ETL, HTL) thickness of (50 nm, 20 nm) gives the maximal out-coupling efficiency of ~25%, while the PEDOT:PSS thickness of 100 nm was used in experiments for sufficient conductance. Evidently, even with optimized layer structures (with particularly thinner HTL thickness of 20 nm), the PEDOT device still exhibits lower optical out-coupling efficeincy than the ITO device. When using a larger HTL thickness typical for OLEDs (e.g. 40-80 nm), the difference could be even more significant. This perhaps explains why previously reported PEDOT devices in general gave lower EQEs than current state-of-the-art OLEDs (with ITO anode).

TABLE 1

The summary of simulation and experiment results for the conventional ITO device, the conventional PEDOT, the TiO$_2$-e/PEDOT and the TiO$_2$-s/PEDOT OLED devices of the invention.

| Device | Calculated Coupling Efficiency [%] | External Quantum Efficiency [%] | Current Efficiency [cd/A] | Power Efficiency [lm/W] |
|---|---|---|---|---|
| ITO | 27 | 26.5 | 99.1 | 119.8 |
| PEDOT | 25 | 23.5 | 90.9 | 101.4 |
| TiO$_2$-e/PEDOT | 38 | 37.0 | 143.8 | 172.5 |
| TiO$_2$-s/PEDOT | 40 | 38.8 | 144.3 | 172.8 |

Figure 4A:
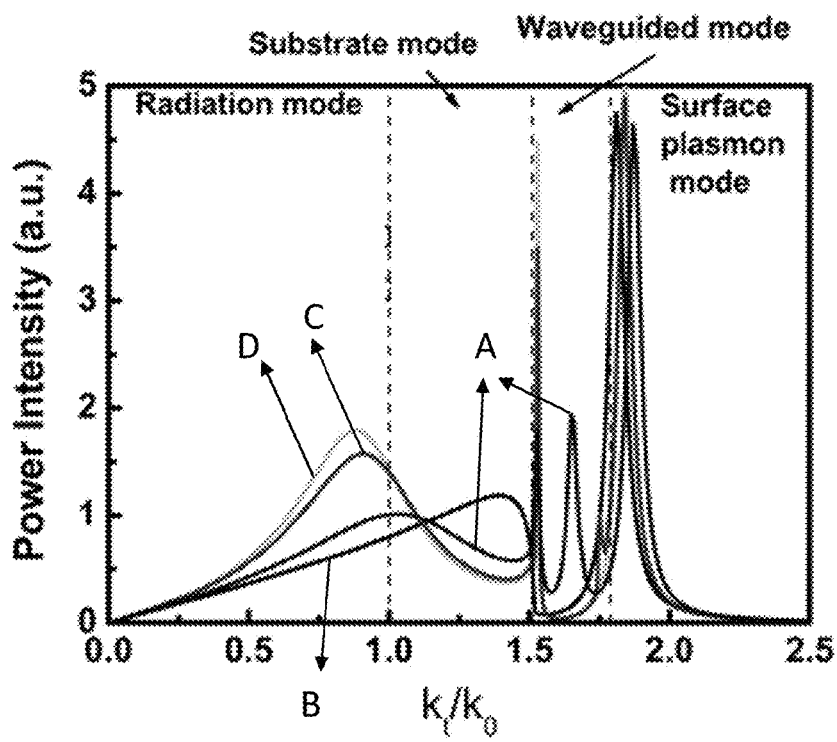
FIG. 4(a) shows the calculated mode distributions (fraction of radiation coupled into different modes as a function of $k_t/k_0$; $k_0$ is the free-space wavevector) of internally generated radiation of the conventional ITO device, the conventional PEDOT device, the $TiO_2$-e/PEDOT device and the $TiO_2$-s/PEDOT device.

FIG. 4(a) shows the calculated mode distributions (fraction of radiation coupled into different modes as a function of $k_t/k_0$; $k_0$ is the free-space wavevector) of internally generated radiation of the four different devices, wherein the curve A represents the conventional ITO device, the curve B represents the conventional PEDOT device, the curve C represents the TiO$_2$-e/PEDOT device of the present invention, and the curve D represents the TiO$_2$-s/PEDOT device of the present invention. In both cases, modes with $0<k_t/k_0<1$, $1<k_t/k_0<1.52$, $1.52<k_t/k_0<1.8$, and $k_t/k_0>1.8$ represent free radiation modes that can be out-coupled to air, substrate modes that are trapped in the substrate, waveguided modes that are trapped and waveguided in the anode/organic layers, and surface-plasmon modes that are guided along the interface between the organic layers and the cathode, respectively.

With the ITO anode (high-index electrode), as shown as the curve A in FIG. 4(a), the optimized ITO device exhibits two distinct waveguided modes at $k_t/k_0=1.53$ (corresponding to transverse magnetic modes) and $k_t/k_0=1.65$ (corresponding to transverse electric modes). Yet with the PEDOT:PSS anode (low-index electrode), as shown as the curve B in FIG. 4(a), waveguided modes in the optimized PEDOT device are almost completely eliminated, leading to more radiation coupled into the substrate (57% coupling efficiency into substrate vs. 48% of the ITO device). However, the adoption of the low-index electrode also varies the angular distribution of radiation in the substrate (e.g., more radiation coupled into larger angles in the substrate). Unfortunately, even in the optimized PEDOT device, radiation within the escape cone of the substrate-air interface (corresponding to radiation modes in FIG. 4(a)) is reduced. Please see Table 1., this is directly reflected in the lower optical out-coupling efficiency of the PEDOT device using the low-index electrode compared to the ITO device (i.e., 25% of the PEDOT device vs. 27% of the ITO device), even in the optically optimized structures.

This dilemma of the low-index electrode (i.e., increased coupling into the substrate but decreased out-coupling into air) may be mitigated by using a structure that can more converge radiation inso the substrate (i.e., less divergent in angles) but not reduce the optical coupling efficiency into the substrate. For instance, a judicious combination of the low-index transparent electrode and a high-index layer (between the low-index electrode and the substrate) may induce a proper microcavity effect that would have radiation into the substrate more convergent in angles and meanwhile the low-index transparent electrode layer between high-index layer and other higher-index organic layers can still lead to suppression of overall waveguided modes and enhancement of optial coupling into substrates. For instance, we consider $TiO_2$ which possesses a refractive index among the highest of materials and is cost-effective and in general environmentally benign. The $TiO_2$-e/PEDOT device of this invention is a layer stacking structures for OLEDs using the low-index PEDOT:PSS anode (first electrode) 120 yet with a TiO2 films (high-index layer 110), which is deposited by e-beam evaporation, inserted between the PEDOT:PSS 110 and the substrate 100. The $TiO_2$-s/PEDOT device of this invention is a layer stacking structures for OLEDs using the low-index PEDOT:PSS anode (first electrode) 120 yet with a TiO2 films (high-index layer 110), which is deposited by RF sputtering, inserted between the PEDOT:PSS 110 and the substrate 100. E-beam evaporated and sputtered $TiO_2$ films had a high refractive index of ~2.28 and ~2.5, respectively, around wavelengths of interest here, as characterized by ellipsometry. The structure of the $TiO_2$-e/PEDOT device or the $TiO_2$-s/PEDOT device then is: glass/$TiO_2$-e or $TiO_2$-s/PEDOT:PSS/TAPC/CBP:Ir(ppy)$_2$(acac) 8 wt. % (20 nm)/B3PYMPM/LiF (0.5 nm)/Al (150 nm).

Figure 3C:
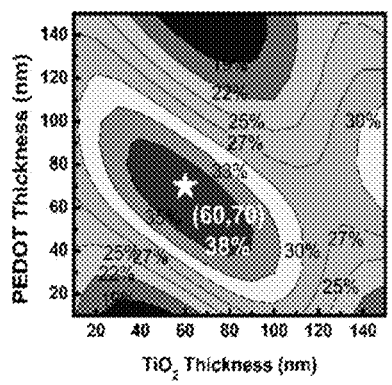
FIG. 3(c) and FIG. 3(d) show the calculated out-coupling efficiencies of the $TiO_2$-e/PEDOT device as a function of the $TiO_2$ and PEDOT:PSS thicknesses (for the example ETL/HTL thicknesses of 50/20 nm) and as a function of ETL and HTL thicknesses (for the example $TiO_2$-e/PEDOT:PSS thicknesses of 60/70).
Figure 3D:
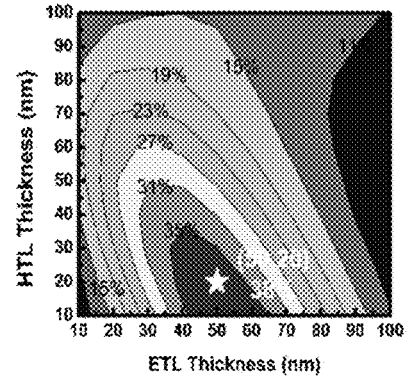
Figure 3E:
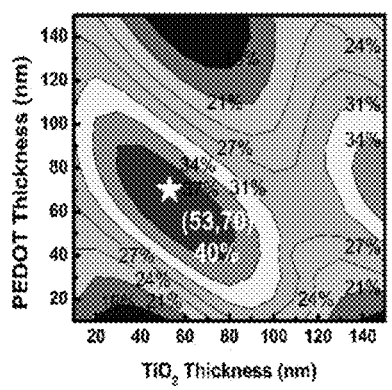
FIG. 3(e) and FIG. 3(f) show the calculated out-coupling efficiencies of the $TiO_2$-s/PEDOT device as a function of the $TiO_2$ and PEDOT:PSS thicknesses (for the example ETL/HTL thicknesses of 50/20 nm) and as a function of ETL and HTL thicknesses (for the example $TiO_2$-s/PEDOT:PSS thicknesses of 53/70 nm, respectively).
Figure 3F:
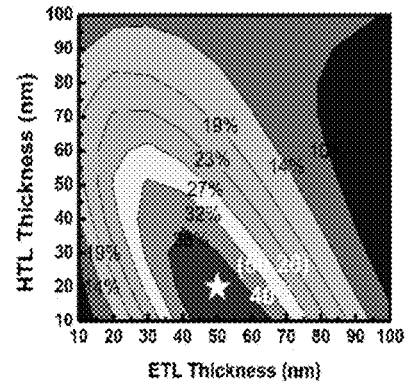

FIG. 3(c) and FIG. 3(d) show the calculated out-coupling efficiencies of the $TiO_2$-e/PEDOT device as a function of the $TiO_2$ and PEDOT:PSS thicknesses (for the example ETL/HTL thicknesses of 50/20 nm) and as a function of ETL and HTL thicknesses (for the example $TiO_2$-e/PEDOT:PSS thicknesses of 60/70). FIG. 3(e) and FIG. 3(f) show the calculated out-coupling efficiencies of the $TiO_2$-s/PEDOT device as a function of the $TiO_2$ and PEDOT:PSS thicknesses (for the example ETL/HTL thicknesses of 50/20 nm) and as a function of ETL and HTL thicknesses (for the example $TiO_2$-s/PEDOT:PSS thicknesses of 53/70 nm, respectively).

Please refer to Table 1, the OLED structures with ($TiO_2$-e, PEDOT:PSS, HTL, ETL) and ($TiO_2$-s, PEDOT:PSS, HTL, ETL) thickness of (60 nm, 70 nm, 20 nm, 50 nm) and (53 nm, 70 nm, 20 nm, 50 nm) give the maximal out-coupling efficiency of ~38% and ~40%, respectively, significantly higher than those of optimized PEDOT device (25%) and ITO device (27%). The calculated mode distributions of these optimal $TiO_2$-e/PEDOT and $TiO_2$-s/PEDOT devices are also shown as curves C and D in FIG. 4(a). With inserting the high-index layer ($TiO_2$ films) beneath PEDOT:PSS, although there is still residual waveguided modes, but their spectral widths and overall ratios are also significantly suppressed in comparison with ITO devices, retaining most of the benefits of using the low-index PEDOT:PSS electrode. The suppressed waveguided modes are effectively coupled to the substrate, but now much more into the radiation modes (escape cone), in contrast to the case of the PEDOT device. Thus, although both optimal PEDOT and $TiO_2$/PEDOT device structures are useful for suppressing waveguided modes and enhancing coupling of internal radiation into the substrate (calculated coupling efficiency into substrate: 58% for $TiO_2$-e/PEDOT device and 59% for $TiO_2$-s/PEDOT device vs. 57% of PEDOT device), yet inserting the high-index $TiO_2$ layer re-shapes the radiation pattern and converges more radiation into the escape cone within the substrate (particularly the effect is even stronger for the device using higher-index $TiO_2$-s). Such effects indeed are associated with different microcavity strengths induced by these different electrode structures.

Figure 4B:
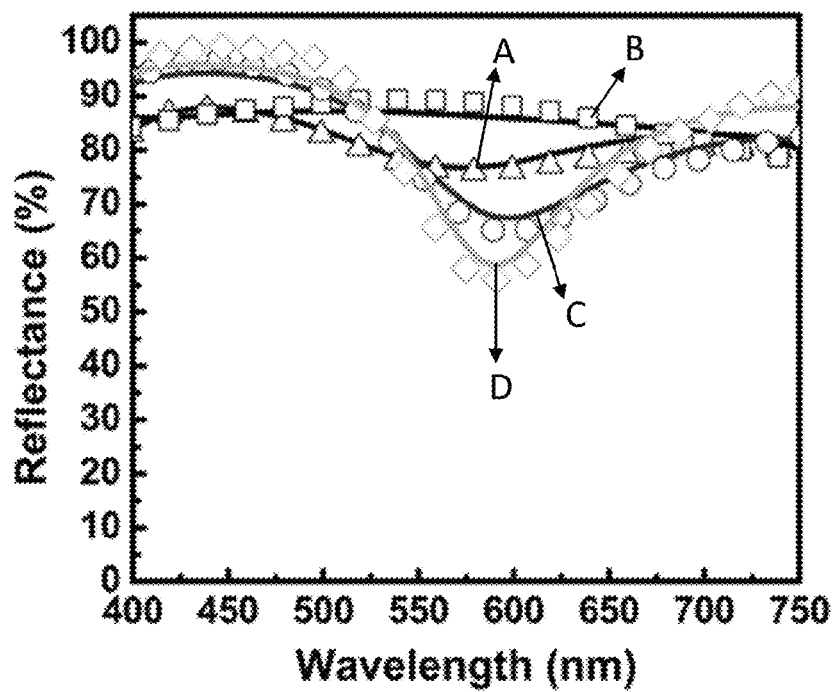
FIG. 4(b) shows measured and calculated reflection spectra of the four optimal devices measured/seen from the outside of the glass substrate.

FIG. 4(b) shows measured and calculated reflection spectra of the four optimal devices measured/seen from the outside of the glass substrate, wherein the curve A represents the conventional ITO device, the curve B represents the conventional PEDOT device, the curve C represents the $TiO_2$-e/PEDOT device of the present invention, and the curve D represents the $TiO_2$-s/PEDOT device of the present invention. Apparently the $TiO_2$/PEDOT devices (particularly the $TiO_2$-s/PEDOT device) exhibit the strongest microcavity resonance (with a broad-band resonance centering around 580-590 nm), compared to the PEDOT device (shows hardly microcavity resonance) and the ITO device. The stronger microcavity effect in $TiO_2$/PEDOT devices is understandable since the three interfaces at TAPC/PEDOT:PSS, PEDOT:PSS/$TiO_2$, and $TiO_2$/glass having larger index mismatches and stronger reflection could collectively form a stronger equivalent dielectric mirror (like distributed Bragg reflector) for the microcavity, if properly designed. Previous studies on microcavity OLEDs had indicated that stronger microcavity effects can significantly alter the spectral and spatial distributions of the internally generated radiation and affect its coupling into air/substrate, and that significant gain in out-coupling efficiency and EQE can be obtained with setting the microcavity resonance wavelength 20-70 nm longer than the intrinsic PL peak wavelength.

According to optical simulation, the optimal ITO device requires a thicker TAPC HTL than optimal PEDOT and $TiO_2$/PEDOT devices (80 nm vs. 20 nm). To ensure similar electrical characteristics between these devices in experiments, for the ITO device, the 80-nm TAPC was composed of a 60-nm p-doped TAPC (TAPC doped with 3 wt. % of $MoO_3$) and a 20-nm non-doped intrinsic TAPC. Thus the actual experiment ITO device structure is: glass/ITO (80 nm)/TAPC: 3 wt. % $MoO_3$ (60 nm)/TAPC (20 nm)/CBP:Ir (ppy)$_2$(acac) 8 wt. % (20 nm)/B3PYMPM (50 nm)/LiF (0.5 nm)/Al (150 nm).

Figure 5A:
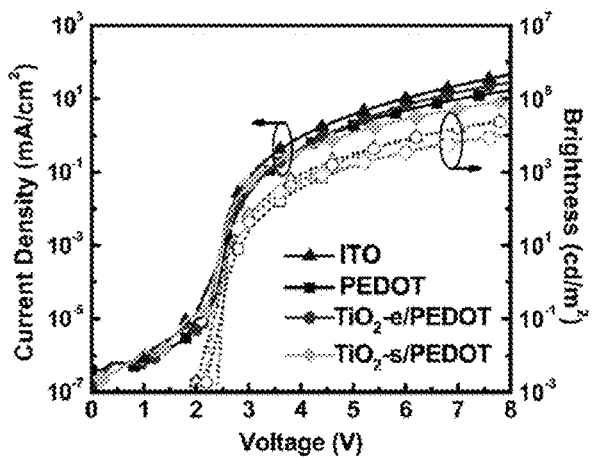
FIG. 5(a) shows the current-voltage-luminance (I-V-L) characteristics of the optimal ITO, PEDOT, $TiO_2$-e/PEDOT and $TiO_2$-s/PEDOT devices.
Figure 5B:
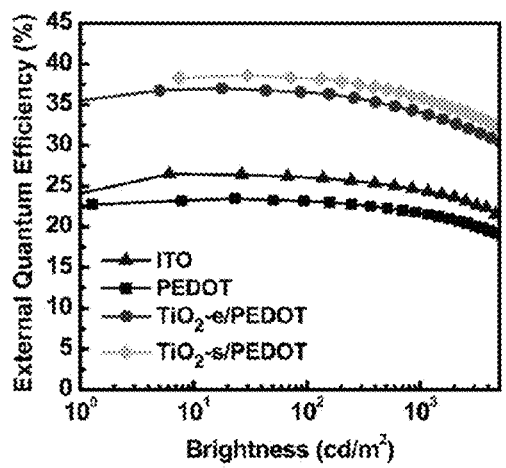
FIG. 5(b) and FIG. 5(c) show EL efficiencies, including EQE, cd/A, and power (luminous) efficiencies, of these ITO, PEDOT, $TiO_2$-e/PEDOT and $TiO_2$-s/PEDOT devices.
Figure 5C:
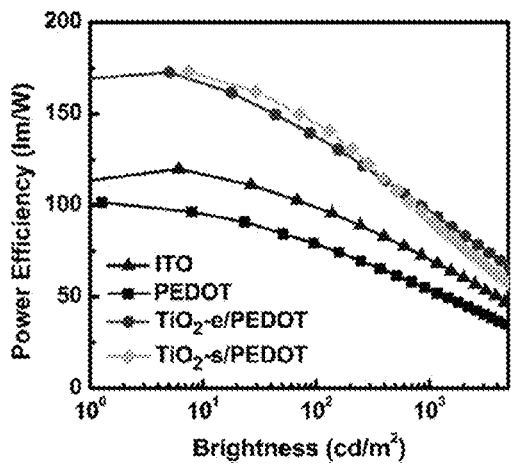

FIG. 5(a) shows the current-voltage-luminance (I-V-L) characteristics of the optimal ITO, PEDOT, $TiO_2$-e/PEDOT and $TiO_2$-s/PEDOT devices. All devices show well-behaved and similar I-V characteristics. It indicates similar carrier injection/conduction characteristics among these devices and that the difference in emission characteristics of these devices can be mainly attributed to the difference in optical properties/structures. EL efficiencies, including EQE, cd/A, and power (luminous) efficiencies, of these three devices are shown in FIG. 5(b), FIG. 5(c) and are summarized in Table 1. The ITO device shows EQE, cd/A, and power (luminous) efficiencies of up to 26.5%, 99.1 cd/A and 119.8 lm/W; the PEDOT device shows EQE, cd/A, and luminous efficiencies of up to 23.5%, 90.9 cd/A, and 101.4 lm/W; while the $TiO_2$-e/PEDOT device gives efficiencies of up to 37.0%, 143.8 cd/A, and 172.5 lm/W; and, the $TiO_2$-s/PEDOT device gives efficiencies of up to 38.8%, 144.3 cd/A, and 172.8 lm/W.

The experiment EQEs are in quantitative agreement with results of optical simulation (please see the calculated optical out-coupling efficiencies in Table 1), indicating rather ideal internal quantum efficiencies in these devices. As expected, the PEDOT device exhibits lower EL efficiencies than the ITO device, while $TiO_2$/PEDOT devices exhibit significantly higher EL efficiencies than both ITO and PEDOT devices and the $TiO_2$-s/PEDOT exhibits the highest EQE of nearly 39%. When measuring EL characteristics of these devices by attaching a large index-matched hemisphere lens (with a diameter of 1.5 cm) to the substrate surface to effectively extract radiation coupled into the substrate, EQEs of 48%, 54%, 55.5%, and 56.6% were obtained for optimal ITO, PEDOT, $TiO_2$-e/PEDOT and $TiO_2$-s/PEDOT devices, respectively, also consistent with calculated coupling efficiencies into the substrate.

Figure 6A:
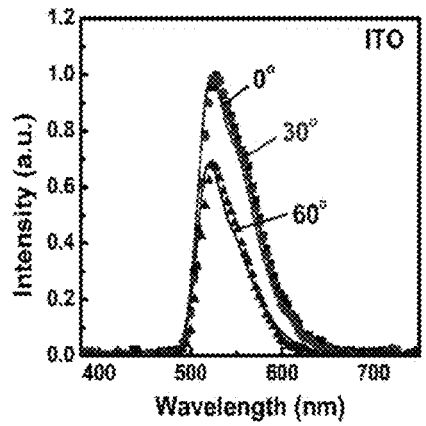
FIGS. 6(a), 6(b), 6(c), and 6(d) show measured (symbols) and calculated (lines) EL spectra with relative intensities at viewing angles of 0°, 30°, and 60° off the surface normal for the ITO, PEDOT, $TiO_2$-e/PEDOT and $TiO_2$-s/PEDOT devices, respectively.
Figure 6B:
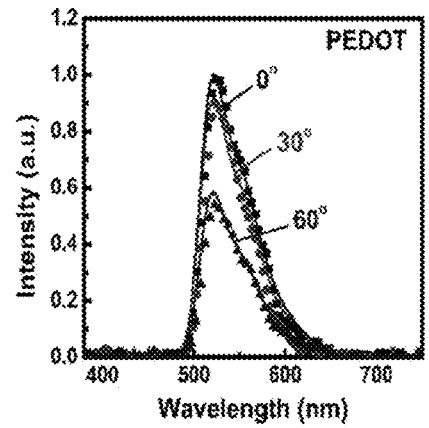
Figure 6C:
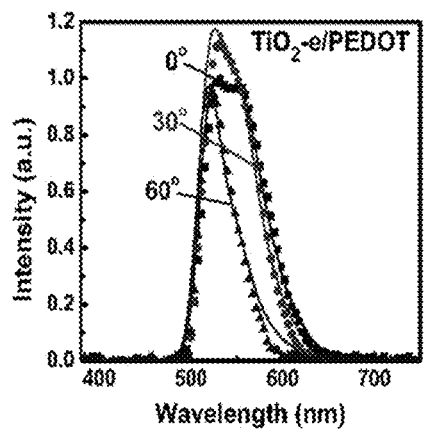
Figure 6D:
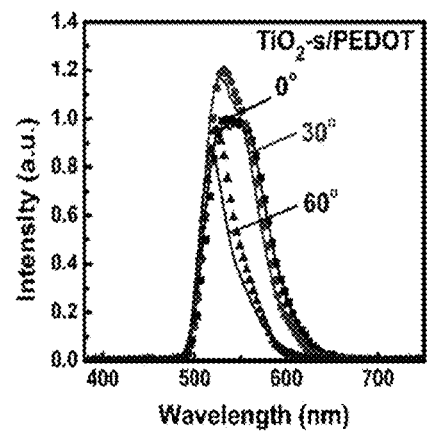
Figure 6E:
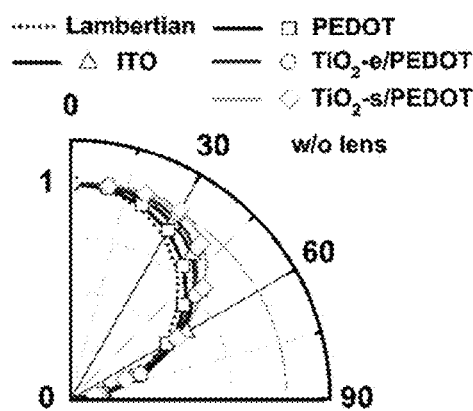
FIG. 6(e) shows measured (symbols) and calculated (lines) angular distributions of the EL intensity (normalized to 0° intensity) for these four devices, along with the Lambertian distribution.
Figure 6F:
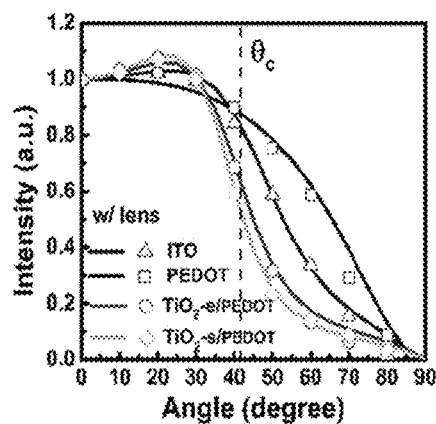
FIG. 6(f) shows the measured emission patterns (angular distribution of EL intensities) inside the substrate for four devices measured by attaching a large hemisphere lens to the outside substrate surfaces with index-matching oil.

FIGS. 6(a), 6(b), 6(c), and 6(d) show measured (symbols) and calculated (lines) EL spectra with relative intensities at viewing angles of 0°, 30°, and 60° off the surface normal for the ITO, PEDOT, $TiO_2$-e/PEDOT and $TiO_2$-s/PEDOT devices, respectively. FIG. 6(e) show measured (symbols) and calculated (lines) angular distributions of the EL intensity (normalized to 0° intensity) for these devices, along with the Lambertian distribution. Agreement between measured and calculated angle-resolved EL characteristics again confirms accuracy of the optical simulation. The optimal PEDOT device having the weakest microcavity exhibits a nearly Lambertian distribution, while optimal ITO and $TiO_2$/PEDOT devices having more prominent microcavity resonance at wavelengths longer than the intrinsic PL peak exhibits a slightly broader angular distribution. In addition, with the strongest and more red-shifted microcavity resonance, $TiO_2$/PEDOT devic show a raised intensity for the longer-wavelength shoulder of the on-axis EL spectrum and its drop with viewing angles. These spectral and angular characteristics are consitent with prveious studies of microcavity OLEDs having resonant wavelengths longer than the intrinsic PL peak wavelength. Although there is slight variation of EL spectra with viewing angles, its effect on colors is only minor. The emission patterns (angular distribution of EL intensities) inside the substrate for these devices were also measured by attaching a large hemisphere lens to the outside substrate surfaces with index-matching oil. Measured emission patterns inside the substrate, along with calculated ones, are shown FIG. 6(f). Radiation in the substrate is more convergent (within smaller angles) for ITO and $TiO_2$/PEDOT devices having stronger microcavities than for the PEDOT device. In particular, the $TiO_2$-s/PEDOT device exhibits the most convergent emission pattern and has the largest ratio of radiation within the escape cone (i.e., within the critical angle $\theta_c$, as shown in FIG. 6(f)) of the substrate-air interface, as expected from overall power spectra of radiation coupled into substrates for three devices ($k_z/k_0 < 1.52$, as shown in FIG. 4(a)).

In summary, a comprehensive theoretical analyses of the optical out-coupling efficiency of OLEDs is performed vs. layer stacking structures for OLEDs using the low-index PEDOT:PSS transparent electrode, the higher-index ITO transparent electrode, and the low-index PEDOT:PSS electrode yet with a high-index TiO2 layer inserted between the PEDOT:PSS and the substrate. By inserting a high-index layer below the PEDOT:PSS electrode, the optical out-coupling efficiency and EQE of PEDOT:PSS OLEDs can be significantly enhanced over those of conventional ITO devices and PEDOT:PSS devices having no high-index layer. Although the low index of PEDOT:PSS electrode helps to suppress waveguided modes and couple more light into the substrate, more radiation is dispatched outside the escape cone and cannot be out-coupled directly. Such a dilemma can be removed by inserting a high-index layer between the PEDOT:PSS electrode and the substrate to induce an appropriate microcavity effect. As such, most of optical benefits of the low-index PEDOT:PSS electrode (suppressed waveguided modes, enhanced optical coupling into substrates) are retained, and yet the radiation into the substrate is now more convergent within the escape cone for direct optical out-coupling. As a result, a simple planar OLED having significantly enhanced optical out-coupling and EQE (nearly 39%) is demonstrated without adopting any external out-coupling technique. Even higher optical out-coupling and EQE (nearly 57%) is demonstrated with adopting the external out-coupling technique at the outer surface of the substrate.

Embodiment of Invention—Example 2

Figure 7:
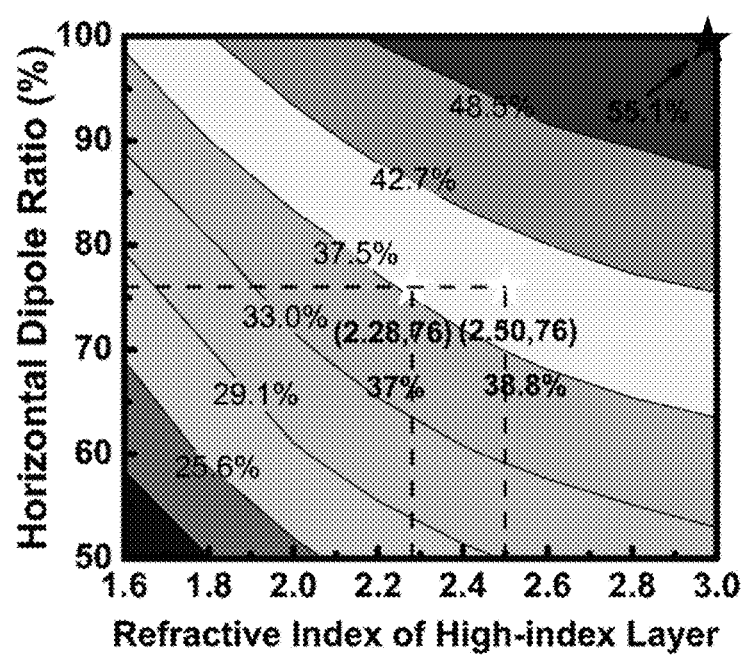
FIG. 7 shows the simulation results of the optimize optical out-coupling efficiency by varying the horizontal dipole ratio of the light emitting layer and the refractive index of the high-index layer below the low-index transparent electrode (n~1.5) in the current device of the invention.

The invention is extendly designed by optical simulation to optimize optical out-coupling efficiency by varying the horizontal dipole ratio of the emitting layer and the refractive index of the high-index layer below the low-index transparent electrode (n~1.5) in the current device structure. The simulation results are shown in FIG. 7, which reveals that the optimal optical out-coupling efficiency increases with both the horizontal dipole ratio and the refractive index of the high-index layer (for example, e-beam evaporated and sputtered $TiO_2$ films had a high refractive index of ~2.28 and ~2.5). With the horizontal dipole ratio approaching ideal 100% and the refractive index appraoching 3, the optimal optical out-coupling efficiency can reach 55%. With ideal (close to 100%) internal EL quantum efficiencies, this corresponds to an EQE of 55% achievable with such a simple planar OLED structure.

Embodiment of Invention—Example 3

Following the general principles of the preceding embodiment example, there could be different variations and modifications of the embodiment.

For instance, in addition to the low-index transparent electrode PEDOT:PSS in example 1, other possible low-index transparent conductors (preferentially with a refractive index <1.7) include nanoporous indium tin oxide, nanoporous fluorine-doped tin oxide, nanoporous aluminum zinc oxide, nanoporous gallium zinc oxide, nanoporous tin oxide, nanoporous niobium-doped titanium oxide, their combinations, and their stacking.

Embodiment of Invention—Example 4

For instance, in addition to the high-index layer ($TiO_2$ films) in example 1, other possible high-index layer materials (preferentially with a refractive index >1.8) include $Ta_2O_5$, $ZrO_2$, $Al_2O_3$, ZnO, $HfO_2$, ZnS, $SiN_x$, $Nb_2O_5$, $CeO_2$, indium tin oxide (ITO), fluorine-doped tin oxide, aluminum zinc oxide, gallium zinc oxide, tin oxide, niobium-doped titanium oxide, their stacking, their combinations, or composite materials containing these high-refractive-index materials.

Embodiment of Invention—Example 5

For instance, the OLED structure in example 1 may be changed to an "inverted" OLED, i.e. the bottom transparent electrode serving as the cathode instead and the top metal electrode serving as the anode. In such "inverted" OLEDs, the low-index first (transparent) electrode is a low-index transparent cathode.

Embodiment of Invention—Example 6

For instance, the out-coupling lens attached to the substrate in example 1 may be replaced with other out-coupling optical element adjacent to the outer surface of the substrate, such as a prism, a pyramid, a hemisphere lens, a macrolens sheet, a microlens sheet, a micro-prism sheet, a micro-pyramid sheet, a micro-particle layer, a nano-particle layer, a microporous layer, a nanoporous layer, a grating sheet, a scattering sheet, a diffuser sheet, arrays of pores, arrays of crevices, arrays of air bubbles, arrays of vacuum pores etc.

Embodiment of Invention—Example 7

For instance, the out-coupling lens attached to the substrate in example 1 may be replaced with other out-coupling surface treatment, such as shaped or roughening treated, forming regular or irregular patterns, such as prism, pyramid, macrolens, microlens, micro-prism, micro-pyramid, or grating etc.

Embodiment of Invention—Example 8

For instance, in addition to the bottom-emitting OLED structure [light emission through the first (transparent) electrode and the substrate] disclosed in example 1, the OLED structure this invention may also adopt the top-emitting structure [light emission not through the substrate but the opposite direction]. In such "top-emitting" OLEDs, the second electrode of the device is deposited closer to the substrate, the low-index first (transparent) electrode is disposed farther away from the substrate, and the high-index layer is further disposed over the first (transparent) electrode.

Embodiment of Invention—Example 9

When used in lighting or display panels, the device disclosed in this invention may further be integrated with metal bus lines or metal grids having high conductivity for current conduction and for uniform current spreading over larger areas.

The above embodiments are only used to illustrate the principles of the present invention, and they should not be construed as to limit the present invention in any way. The above embodiments can be modified by those with ordinary skill in the art without departing from the scope of the present invention as defined in the following appended claims.

What is claimed is:

1. An electroluminescent (EL) device, comprising:
a high-index layer, having a first refractive index $n_H$ more than 1.8;
a first electrode, being transparent and disposed adjacent to the high-index layer;
one or more functional layers, disposed adjacent to the first electrode and opposite to the high-index layer, including a light emitting layer, wherein a main wavelength of a light emitted from the light emitting layer is $\lambda$;
a second electrode, disposed adjacent to the one or more functional layers and opposite to the first electrode; and,
one or more sub-layers from Layer 1 to Layer j, disposed in conjunction with the first electrode, which is sandwiched between the high-index layer and the light emitting layer, and thicknesses of the sub-layers and the first electrode correspond to:

$$\sum_{i=1}^{j} k_i L_i + k_c L_c = \frac{\pi}{2}$$

or odd multiple of $$\frac{\pi}{2},$$

wherein j is a natural number, $k_i$ is a wave vector of Layer i, $k_i = 2\pi \times n_i/\lambda$, $n_i$ is a refractive index of Layer i, $L_i$ is a thickness of Layer i, $k_c$ is a wave vector of the first electrode, $k_c = 2\pi \times n_L/\lambda$; and $L_c$ is a thickness of the first electrode, which is at least equal to or larger than the total thickness of the sub-layers from layer 1 to layer j;
wherein the first electrode has a second refractive index $n_L$ less than 1.7.

2. The electroluminescent device of claim 1, wherein the high-index layer is $TiO_2$ films, which is deposited by e-beam evaporation or by RF sputtering.

3. The electroluminescent device of claim 1, wherein a thickness of the high-index layer is about $\lambda/4n_H$ or odd multiple of $\lambda/4n_H$, and a thickness of the first electrode is about $\lambda/4n_L$ or odd multiple of $\lambda/4n_L$.

4. The electroluminescent device of claim 1, wherein the first refractive-index material of the high-index layer is selected from the group consisting of $TiO_2$, $Ta_2O_5$, $ZrO_2$, $Al_2O_3$, $ZnO$, $HfO_2$, $ZnS$, $SiN_x$, $Nb_2O_5$, $CeO_2$, indium tin oxide (ITO), fluorine-doped tin oxide, aluminum zinc oxide, gallium zinc oxide, tin oxide, niobium-doped titanium oxide, their combination, and their stacking.

5. The electroluminescent device of claim 1, wherein the second refractive-index material of the first electrode is selected from the group consisting of PEDOT:PSS, nanoporous indium tin oxide (ITO), nanoporous fluorine-doped tin oxide, nanoporous aluminum zinc oxide, nanoporous gallium zinc oxide, nanoporous tin oxide, nanoporous niobium-doped titanium oxide, their combination, and their stacking.

6. The electroluminescent device of claim 1, wherein the light emitting layer has a preferential horizontal emitting dipole orientation, and the horizontal emitting dipole ratio is larger than 70%.

7. The electroluminescent device of claim 6, wherein the horizontal dipole ratio of the light emitting layer is approaching 100% and the higher refractive index $n_H$ of the high-index layer is approaching 3.

8. The electroluminescent device of claim 1, further comprising a substrate or a superstrate adjacent to the high-index layer and opposite to the first electrode, and the substrate or the superstrate has a refractive index lower than the refractive index $n_H$ of the high-index layer.

9. The electroluminescent device of claim 8, wherein the substrate or the superstrate has an outer sub-surface opposite to the high-index layer, and the outer sub-surface is shaped or roughening treated to form regular or irregular patterns, such as prism, pyramid, macrolens, microlens, micro-prism, micro-pyramid, or grating.

10. The electroluminescent device of claim 8, wherein the substrate or the superstrate has an outer sub-surface opposite to the high-index layer, and an optical element adjacent to the outer sub-surface, the optical element comprises a prism, a pyramid, a hemisphere lens, a macrolens sheet, a microlens sheet, a micro-prism sheet, a micro-pyramid sheet, a microparticle layer, a nano-particle layer, a microporous layer, a nanoporous layer, a grating sheet, a scattering sheet, a diffuser sheet, arrays of pores, arrays of crevices, arrays of air bubbles, or arrays of vacuum pores.

11. The electroluminescent device of claim 1, when used in lighting or display panels, wherein further be integrated with metal bus lines or metal grids having high conductivity for current conduction and for uniform current spreading over larger areas.

* * * * *